United States Patent
Moore et al.

(10) Patent No.: US 11,353,828 B2
(45) Date of Patent: *Jun. 7, 2022

(54) LATCHED GRAY CODE FOR TOF APPLICATIONS

(71) Applicant: STMICROELECTRONICS (RESEARCH & DEVELOPMENT) LIMITED, Marlow (GB)

(72) Inventors: John Kevin Moore, Edinburgh (GB); Neale Dutton, Edinburgh (GB)

(73) Assignee: STMICROELECTRONICS (RESEARCH & DEVELOPMENT) LIMITED, Marlow (GB)

(*) Notice: Subject to any disclaimer, the term of this patent is extended or adjusted under 35 U.S.C. 154(b) by 0 days.

This patent is subject to a terminal disclaimer.

(21) Appl. No.: 17/201,994

(22) Filed: Mar. 15, 2021

(65) Prior Publication Data

US 2021/0302917 A1 Sep. 30, 2021

Related U.S. Application Data

(63) Continuation of application No. 16/834,286, filed on Mar. 30, 2020, now Pat. No. 10,976,709.

(51) Int. Cl.
| | |
|---|---|
| *H03M 1/50* | (2006.01) |
| *G04F 10/00* | (2006.01) |
| *G01S 17/894* | (2020.01) |
| *H03K 23/00* | (2006.01) |
| *G01T 1/24* | (2006.01) |
| *G01S 7/4865* | (2020.01) |

(52) U.S. Cl.
CPC .......... *G04F 10/005* (2013.01); *G01S 7/4865* (2013.01); *G01S 17/894* (2020.01); *G01T 1/248* (2013.01); *H03K 23/005* (2013.01)

(58) Field of Classification Search
CPC ..... G04F 10/005; H03K 23/005; G01T 1/248; G01S 7/4865; G01S 17/894; H03M 1/00
USPC .......................................................... 341/166
See application file for complete search history.

(56) References Cited

U.S. PATENT DOCUMENTS

| | | | |
|---|---|---|---|
| 3,941,926 A | 3/1976 | Slobodzian et al. |
| 3,979,555 A | 9/1976 | Opittek et al. |
| 5,045,854 A | 9/1991 | Windmiller |
| 5,088,488 A | 2/1992 | Markowitz et al. |
| 5,535,354 A | 7/1996 | Reiff |

(Continued)

FOREIGN PATENT DOCUMENTS

| | | |
|---|---|---|
| EP | 0444911 A1 | 9/1991 |
| WO | 2018122560 A1 | 7/2018 |

OTHER PUBLICATIONS

Charbon, E., et al., "ToF Range-Imaging Cameras," Fabio Remondino and David Stoppa, editors, Springer Science +Business Media (www.springer.com), © Springer-Verlag Berlin Heidelberg 2013, 6 pages.

(Continued)

*Primary Examiner* — Jean B Jeanglaude
(74) *Attorney, Agent, or Firm* — Slater Matsil, LLP

(57) ABSTRACT

In an embodiment, a method includes: providing a gray-coded time reference to a time-to-digital converter (TDC); receiving an event from an event signal; latching the gray-coded time reference into a memory upon reception of the event signal; and updating a time-of-flight (ToF) histogram based on the latched gray-coded time reference.

20 Claims, 6 Drawing Sheets

(56) References Cited

U.S. PATENT DOCUMENTS

| | | |
|---|---|---|
| 5,740,460 A | 4/1998 | Wise et al. |
| 5,784,624 A | 7/1998 | Douglass et al. |
| 5,828,907 A | 10/1998 | Wise et al. |
| 6,212,628 B1 | 4/2001 | Abercombie et al. |
| 6,260,088 B1 | 7/2001 | Gove et al. |
| 6,727,738 B2 | 4/2004 | Tsukikawa |
| 6,809,666 B1 | 10/2004 | Ewedemi et al. |
| 6,959,293 B2 | 10/2005 | Pirim |
| 7,894,686 B2 | 2/2011 | Jang |
| 8,300,058 B2 | 10/2012 | Navon et al. |
| 9,281,817 B2 | 3/2016 | Altieri et al. |
| 9,547,881 B2 | 1/2017 | Xu et al. |
| 9,639,063 B2 | 5/2017 | Dutton et al. |
| 10,416,293 B2 | 9/2019 | Buckley et al. |
| 10,715,754 B2 | 7/2020 | Moore et al. |
| 10,620,300 B2 | 10/2020 | Sharma et al. |
| 2005/0025097 A1 | 2/2005 | Paneth et al. |
| 2005/0046717 A1 | 3/2005 | Lapstun et al. |
| 2005/0052556 A1 | 3/2005 | Henderson et al. |
| 2007/0154107 A1* | 7/2007 | Jang ............... G06T 5/40 382/266 |
| 2009/0228737 A1 | 9/2009 | Navon et al. |
| 2012/0170029 A1 | 7/2012 | Azzazy et al. |
| 2013/0038352 A1* | 2/2013 | Gupta ............ H03K 5/19 327/20 |
| 2014/0189320 A1* | 7/2014 | Kuo ............ G06F 9/30021 712/222 |
| 2015/0041625 A1 | 2/2015 | Dutton et al. |
| 2017/0052065 A1 | 2/2017 | Sharma et al. |
| 2017/0163262 A1 | 6/2017 | Zhao et al. |
| 2018/0164415 A1 | 6/2018 | Buckley et al. |
| 2018/0246212 A1 | 8/2018 | Moore et al. |
| 2018/0253404 A1 | 9/2018 | Moore et al. |
| 2019/0056497 A1 | 2/2019 | Pacala et al. |
| 2019/0146073 A1 | 5/2019 | Gutierrez et al. |
| 2019/0230304 A1 | 7/2019 | Moore et al. |
| 2020/0116383 A1 | 4/2020 | Erdogan et al. |
| 2020/0158837 A1 | 5/2020 | Sharma et al. |
| 2020/0233068 A1 | 7/2020 | Henderson et al. |

OTHER PUBLICATIONS

Niclass, C. et al., "A 100-m Range 10-Frame/s 340 x 96-Pixel Time-of-Flight Depth Sensor in 0.18-um Cmos," IEEE Journal of Solid-State Circuits, vol. 48, No. 2, Feb. 2013, pp. 559-572.

* cited by examiner

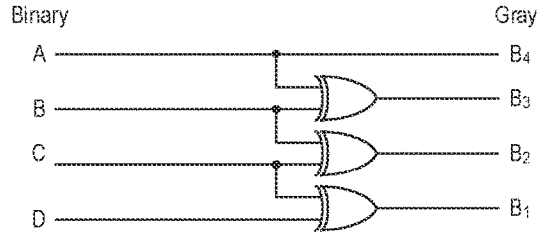
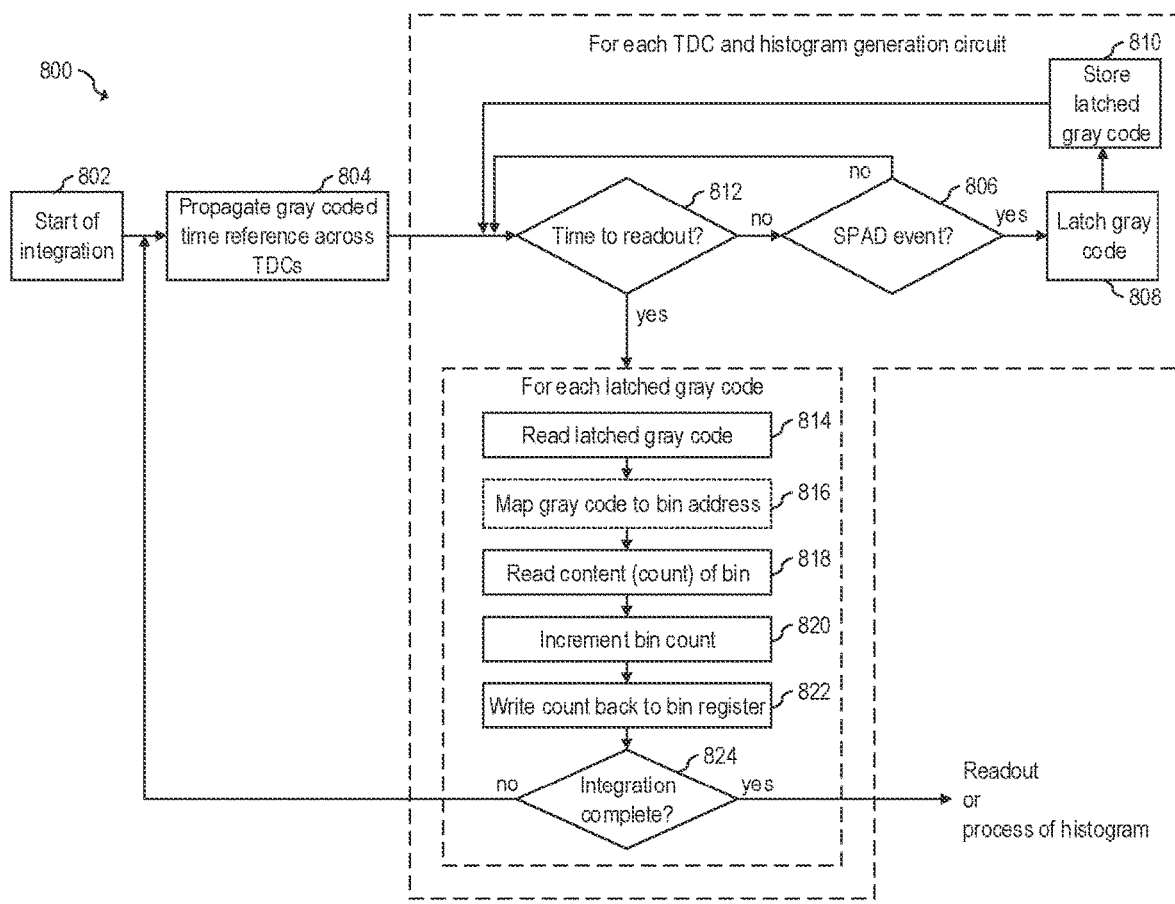
FIG. 7
FIG. 8

US 11,353,828 B2

LATCHED GRAY CODE FOR TOF APPLICATIONS

CROSS-REFERENCE TO RELATED APPLICATIONS

This application is a continuation of U.S. application Ser. No. 16/834,286, filed on Mar. 30, 2020, which application is hereby incorporated herein by reference.

TECHNICAL FIELD

The present disclosure relates generally to an electronic system and method, and, in particular embodiments, to a latched gray code for time-of-flight (ToF) applications.

BACKGROUND

A TDC provides a digital representation of a time associated with events. For example, a TDC may be used to measure a time between a first event and a second event.

An implementation of a TDC may use a counter. The counter is started when the first event occurs and it is stopped when the second event occurs. The resulting count of the counter is a representation of the time between the first event and the second event. The time may be calculated by using the resulting count and the frequency of the clock received by the counter. In this type of TDC implementation, a higher clock frequency typically results in higher time resolution.

A TDC may be used, for example, in ranging systems that use time of flight (ToF) techniques to determine distance. For example, in ToF systems, a pulse of light is emitted, e.g., with a vertical-cavity surface-emitting laser (VCSEL) and reflected off an object back to a photonic sensor, such as a single photon avalanche diode (SPAD). The time taken for the light to travel to the object and be reflected back onto the single photonic sensor may be used to determine the distance between the object and the device based on the known speed of light. In such ToF system, a TDC may be used to generate a digital representation of the time between the transmitting of the pulse of light and the receiving of the reflected pulse by the photonic sensor.

SUMMARY

In accordance with an embodiment, a method includes: providing a gray-coded time reference to a TDC; receiving an event from an event signal; latching the gray-coded time reference into a memory upon reception of the event signal; and updating a ToF histogram based on the latched gray-coded time reference.

In accordance with an embodiment, a circuit includes: a first input configured to receive an event; a second input configured to receive a gray-coded time reference; a first register configured to latch the gray-coded time reference upon reception of the event; and a histogram generation circuit configured to update a bin register of a histogram storage, the bin register having an address based on a content of the first register.

In accordance with an embodiment, a ToF system includes: an illumination source configured to emit light pulses; a SPAD array, a plurality of TDCs coupled to the SPAD array, and a plurality of histogram generation circuits. Each histogram generation circuit of the plurality of histogram generation circuits is coupled to a respective TDC of the plurality of TDCs. Each TDC includes: a first input coupled to a respective SPAD of the SPAD array, a second input configured to receive a gray-coded time reference, and a first register configured to latch the gray-coded time reference upon activation of the respective SPAD. Each histogram generation circuit of the plurality of histogram generation circuits is configured to update a respective bin register of a respective histogram storage, the respective bin register having an address based on a content of the respective first register.

BRIEF DESCRIPTION OF THE DRAWINGS

For a more complete understanding of the present invention, and the advantages thereof, reference is now made to the following descriptions taken in conjunction with the accompanying drawings, in which:

FIG. 7 shows a conventional implementation of a 4-bit binary to gray converter;

FIG. 8 shows a flow chart of an embodiment method for generating, storing, and reading ToF histograms using a gray-coded time reference, according to an embodiment of the present invention;

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
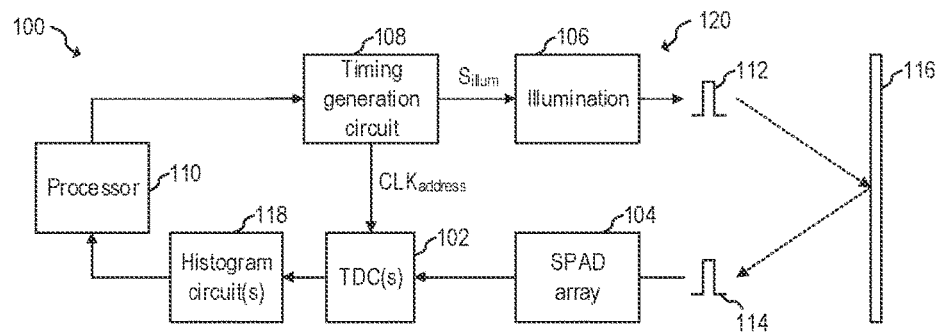
FIG. 1 shows a ToF imaging system, according to an embodiment of the present invention.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a gray-coded reference address used for the generation of time stamps and for the generation and addressing of corresponding histograms of a ToF applications, such as proximity sensors, light detection and ranging (LIDAR), depth profiling, autofocus for cameras, and others. Embodiments may also be used in applications that measure time between events and/or utilize time stamps of events. Some embodiments may use a time reference address that is not gray-coded, such as a binary-coded time reference address, or others.

In an embodiment of the present invention, a gray-coded time reference (address) that is periodically updated is propagated across a SPAD array, where each SPAD of the SPAD array is associated with a corresponding TDC. When a SPAD is activated (e.g., by a reflected light pulse), the corresponding TDC latches the gray-coded address and uses such latched code to produce a time stamp indicative of the time in which the corresponding SPAD was activated. In some embodiments, the latched gray-coded address is directly associated with a bin of a histogram. Such bin is then incremented to reflect that the SPAD was activated at the time associated with the timestamp.

In some embodiments, using a gray-coded address as a time reference for the TDC advantageously results in power savings since only a single bit is updated for each time step, thereby minimizing the number of clock edges of the time reference. Additional advantages of some embodiments include improved routing congestion and increased resolution, e.g., without increasing the power consumption, when compared with conventional solutions.

In some embodiments, using a gray-coded time reference advantageously prevent latching of an incorrect code. For example, the transition between 0001 to 0010 may be incorrectly sampled as 0011. However, such incorrect sample (of 0011) may be corrected to 0010 since only 1 bit changes at a time.

FIG. 1 shows ToF imaging system 100, according to an embodiment of the present invention. ToF imaging system 100 includes illumination source 106, SPAD array 104 TDC 102, histogram circuit 118, processor no, and timing generation circuit 108. In some embodiments, TDC 102 and histogram circuit 118 are distributed inside SPAD array 104. In other embodiments, TDC 102 and histogram circuit 118 are disposed adjacent to SPAD array 104. In some embodiments, histogram circuit 118 is implemented inside processor 110.

During normal operation, illumination source 106 emits radiation pulses 112 (e.g., light signals or light pulses) towards object 116, e.g., at times controlled by timing generator circuit 108. Reflected radiation pulses 114 are sensed by SPAD array 104. TDC(s) 102 generate digital representations of the of the time between the emissions of radiation pulses 112 and receptions of reflected radiation pulses 114 and histogram generation circuit(s) 118 generate ToF histograms based on the output of TDC(s) 102. Processor no then processes the histograms, e.g., to determine the distance to object 116.

A ToF histogram is a histogram in which its bins correspond to different times from emission of a radiation pulse (e.g., 112). Generally, lower bins (e.g., decimal bins 1 and 2, or equivalently binary bins 00 and 01) correspond to shorter times (and therefore closer targets), while higher bins (e.g., decimal bins 9 and 10, or equivalently binary bins 1001 and 1010) correspond to longer times (and therefore farther targets).

As will be explained later, TDC(s) 102 use gray-coded time reference $CLK_{address}$ to generate a timestamp indicative of the ToF. Gray-coded time reference $CLK_{address}$ is a reference address that periodically changes in accordance with a gray code (i.e., only a single bit of the reference address $CLK_{address}$ changes each time the reference address $CLK_{address}$ increments the time step). In some embodiments, only a single bit of gray-coded time reference $CLK_{address}$ changes during the portion of the shot when the TDC is able to latch events.

As will be explained later (e.g., in FIG. 6), it is possible convert from a gray-coded histogram to a binary-histogram.

Illumination source 106 may be implemented in any way known in the art. For example, illumination source 106 may be implemented as a VCSEL. Other implementations are also possible.

Processor 110 may be implemented as a general purpose digital signal processor (DSP), processor or controller that includes, for example, combinatorial circuits coupled to a memory. Processor 110 may also be implemented as a custom application-specific integrated circuit (ASIC). Other implementations are also possible.

SPAD array 104 includes an array of SPADs arranged in rows and columns, and may be implemented in any way known in the art. In some embodiments, each SPAD of SPAD array 104 is coupled to a corresponding TDC of TDC(s) 102. In some embodiments, a plurality of SPADs share the same TDC via, e.g., an OR tree. For example, FIGS. 2 and 3 show schematic diagrams of possible implementations of the coupling of a TDC 102 and corresponding and histogram generation circuit 118 to SPAD array 104, according to embodiments of the present invention.

Figure 2:
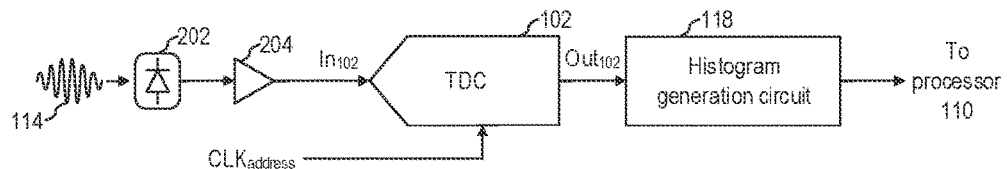
FIGS. 2 and 3 show schematic diagrams of possible implementations of the coupling of a TDC of FIG. 1 and corresponding and histogram generation circuit of FIG. 1 to the SPAD array of FIG. 1, according to embodiments of the present invention.
Figure 3:
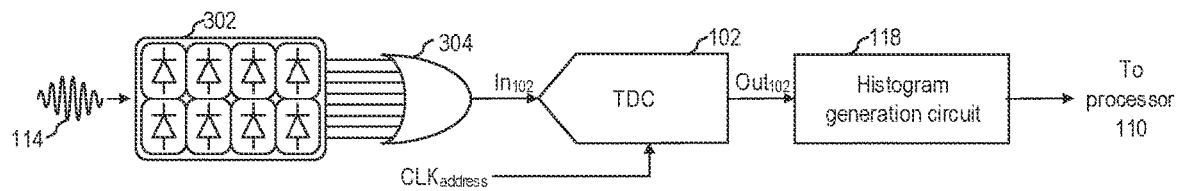

As shown in FIG. 2, in some embodiments each TDC 102 may be coupled to a single SPAD 202 via buffer 204. As shown in FIG. 3, in some embodiments each TDC 102 may be coupled to a plurality of SPADs 302 via OR tree 304.

Buffer 204 and OR tree 304 may be implemented in any way known in the art.

TDC 102 is configured to produce a timestamp $Out_{102}$ upon activation of input $In_{102}$ (e.g., when $In_{102}$ transitions from low to high), based on the gray-coded address received as a time reference, and may otherwise be implemented, e.g., using combinatorial logic in ways known in the art.

Figure 4:
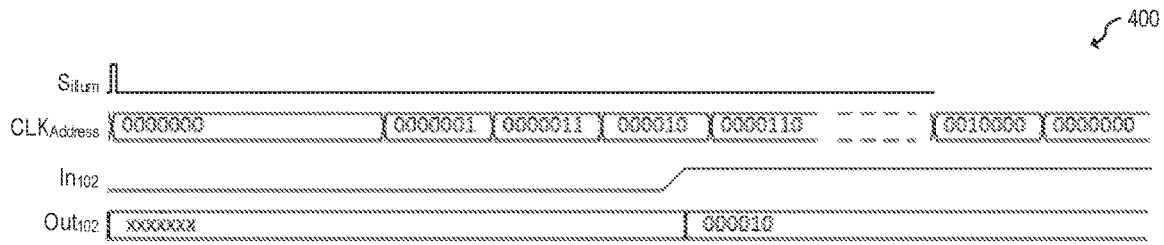
FIG. 4 shows a timing diagram illustrating the reference address of FIG. 1 and the input and output signals of the TDC of FIG. 2 or 3, according to an embodiment of the present invention.

FIG. 4 shows timing diagram 400 illustrating reference address $CLK_{address}$, input $In_{102}$ of TDC 102, and output $Out_{102}$ of TDC 102, according to an embodiment of the present invention.

As shown in FIG. 4, reference address $CLK_{address}$ periodically updates by changing a single bit during each time step. Each code of reference address $CLK_{address}$ is indicative of a time duration from a pulse of signal $S_{illum}$ (which is the signal that illumination source 106 to generate a light pulse 112).

When input $In_{102}$ is asserted (e.g., transitions from low to high), the code that reference address $CLK_{address}$ has at the time input $In_{102}$ is asserted is latched into output $Out_{102}$.

Since, in some embodiments, the reference address $CLK_{address}$ is latched locally inside the TDC upon occurrence of the SPAD event, readout can be made at a later time, thereby advantageously causing routing to not be ToF time critical. Therefore, in some embodiments, routing can be advantageously optimized, e.g., to reduce area, without affecting ToF performance.

Figure 5:
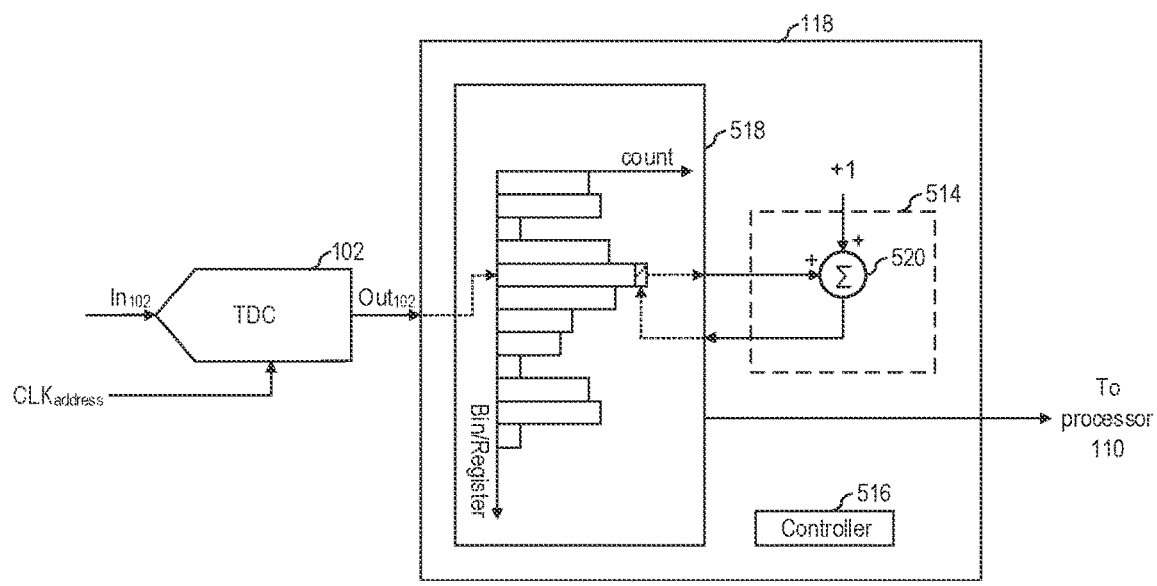
FIG. 5 shows a possible implementation of the histogram generation circuit of FIG. 2 or 3, according to an embodiment of the present invention.

FIG. 5 shows a possible implementation of histogram generation circuit 118, according to an embodiment of the present invention. Histogram circuit 118 includes histogram storage 518, accumulator circuit 514, and controller 516. Histogram storage 518 includes memory storage for each bin of the histogram. For example, in some embodiments, histogram storage 518 includes a register for each bin of the histogram.

During normal operation, TDC 102 generates timestamp $Out_{102}$, indicative of the time duration between the emission of light pulse 112 and the activation of input $In_{102}$. The code contained in output $Out_{102}$ is used to address the corresponding bin of the histogram in histogram storage 518 to update the count of the bin e.g., by controller 516 performing a read, update, write-back operation. For example, in some embodiments, controller 516 reads the bin of histogram storage 518 that corresponds to output $Out_{102}$ (e.g., the bin with the address equal to the value contained in output $Out_{102}$, increments the content read by 1 using adder 520 of accumulator circuit 514, and writes back the accumulated data into the bin of histogram storage 518 that corresponds to output $Out_{102}$.

Controller 516 may be implemented as a controller or processor that includes, for example, combinatorial circuits coupled to a memory. Other implementations are also possible.

Histogram storage 518 may be implemented with, e.g., volatile or non-volatile memory. For example, in some embodiments, histogram storage 518 may be implemented by a bank of registers, where each register includes a plurality of flip-flops. In some embodiments, storage 518 may be implemented by static random-access memory (SRAM), latch-based memory (latch cells), synchronous digital counters, and/or ripple counters (e.g., made with D-flip-flops). Other implementations are also possible.

Accumulator 514 may be implemented in any way known in the art.

Figure 6:
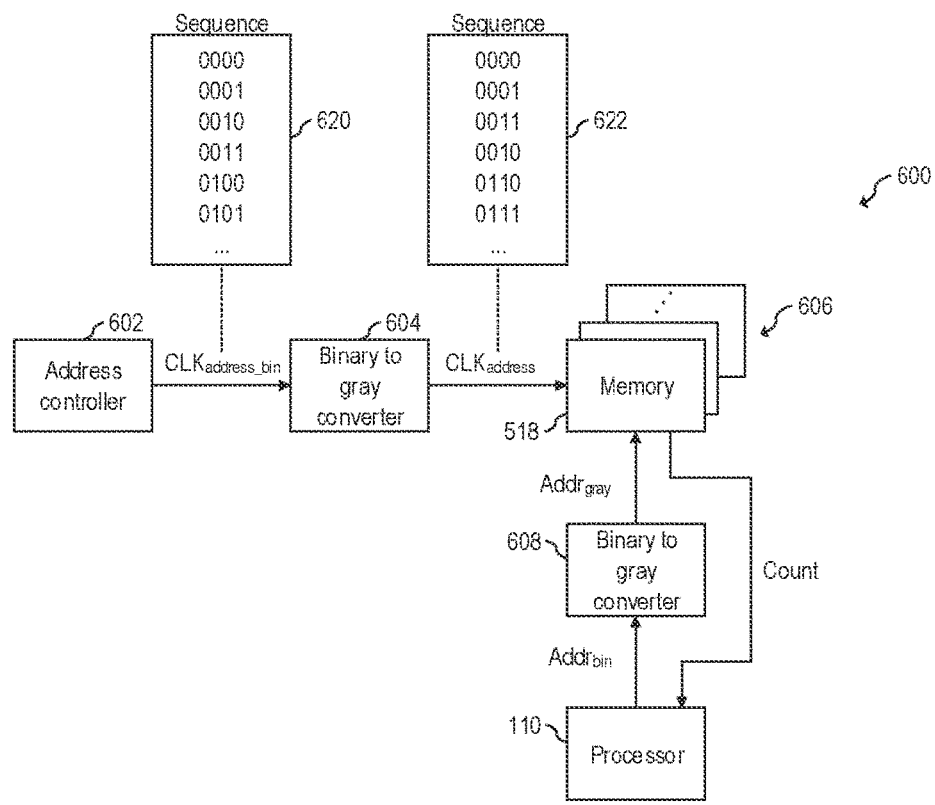
FIG. 6 shows a block diagram illustrating an aspect of the generation and addressing of histograms generated by the histogram generation circuit of FIG. 5, according to an embodiment of the present invention.

FIG. 6 shows block diagram 600 illustrating an aspect of the generation and addressing of histograms generated by histogram generation circuits 118, according to an embodiment of the present invention.

During normal operation, address controller 602 generates binary reference address $CLK_{address\_bin}$, e.g., by sequentially incrementing the address for each time step. Sequence 620 shows a possible sequence of addresses of binary reference address $CLK_{address\_bin}$.

Binary to gray converter 604 receives each address and converts it into gray code. Sequence 622 shows a sequence of addresses of gray reference address $CLK_{address}$ that corresponds to the sequence 620 of binary references address $CLK_{adress\_bin}$.

Gray-coded reference address $CLK_{address}$ is propagated to each TDC 102 associated with SPAD array 104. In some embodiments, such as in embodiments in which the TDC is distributed inside SPAD array 104, gray reference address $CLK_{address}$ is propagated across SPAD array 104. In other embodiments, such as in embodiments in which TDCs 102 are located in a physical location adjacent to SPAD array 104, gray reference address $CLK_{address}$ is propagated outside SPAD array 104.

Gray-coded reference address $CLK_{address}$ is used, e.g., as described with respect to FIGS. 4 and 5, to generate and store respective histograms in respective histogram storages 518 (which collectively are referred to as memory 606 in FIG. 6).

Once the histograms are stored in memory 606, processor 110 reads the counts of each bin of each histogram. For example, for each histogram, processor 110 generates a binary sequence of address $Addr_{bin}$. Binary to gray converter 608 converts the received binary address $Addr_{bin}$ and reads the count associated with that $Addr_{bin}$ from histogram storage 518. In this way, processor 110 receives the counts of the bins sequentially (in binary sequence) despite the bins being stored according to gray-coded addresses. Effectively, processor 110 receives a binary-coded histogram from histogram storage 518, even though histogram storage 518 may store the histogram as a gray-coded histogram.

Address controller 602 may be implemented in any way known in the art. For example, in some embodiments, address controller 602 may be implemented as a digital counter.

Memory 606 (e.g., RAM) is a (e.g., volatile or non-volatile) memory that is the aggregate of each histogram storage 518 associated with SPAD array 104. In some embodiments, memory 606 may be physically distributed across SPAD array 104. In other embodiments, memory 606 may be implemented, e.g., in a physical location that is adjacent to SPAD array 104.

Binary to gray converters 604 and 608 may be implemented in any way known in the art. For example, FIG. 7 shows a conventional implementation of a 4-bit binary to gray converter. In some embodiments, binary to gray converter 604 may be implemented inside address controller 602. In some embodiments, binary to gray converter 608 may be implemented inside processor 110.

FIG. 8 shows a flow chart of an embodiment method for generating, storing, and reading ToF histograms using a gray-coded time reference, according to an embodiment of the present invention. As shown in FIG. 8, steps 806, 808, 810, 812, 814, 816, 818, 820, 822, and 824 may be performed by each TDC and corresponding histogram generation circuit.

During step 802, a light pulse 112 is emitted by illumination source 106 (thereby marking the beginning of a shot cycle), and TDC(s) 102 and corresponding histogram generation circuit(s) 118 begin the integration process (in which activations of SPADs are counted, e.g., for ToF determinations).

During step 804, a gray-coded time reference $CLK_{address}$ is distributed across TDC(s) associated with SPAD array 104. When a SPAD activation is detected (during step 806) the gray code that the gray-coded time reference $CLK_{address}$ has at the time of activation is latched (during step 808) by the corresponding TDC (e.g., as shown in FIG. 4), and stored in a temporary memory (e.g., a temporary register) during step 810.

If it is determined during step 812 that it is not yet time to readout the latched code (i.e., if more SPAD events can be captured in the current shot cycle), then step 806 is performed next.

The time to readout determination (during step 812) may be based on a predetermined pulse repetition time (PRT) (i.e., based on a fixed time between emissions of light pulses 112). It is thus possible to capture more than one SPAD activation per emission of light pulse 112.

In some embodiments, the time to readout determination (during step 812) may be asynchronous (e.g., when a predetermined number of SPAD activations are detected, such as 1 or 2, then step 812 outputs yes). Therefore, in some embodiments, step 806 may be performed after 804 and without performing step 812.

If it is determined during step 812 that it is time to readout the latched code, then, for each latched gray code, the latched gray code is read (from, e.g., a temporary storage) during step 814, gray code is mapped to a bin address (e.g., a register address corresponding to the corresponding bin) during step 816, the content of the bin register corresponding to the latched gray code (the count of the bin) is read during step 818, the count of the bin is incremented, e.g., by 1, during step 820, and the bin register is written back with the incremented count during step 822. As shown, steps 818, 820, are 822 a read, accumulate, write-back operation on the bin register (of histogram storage 518).

In some embodiments, the gray code is directly mapped to the bin register address (i.e., the gray code is the bin register address). In such embodiments, step 816 may be omitted. In embodiments in which the gray code is not directly mapped to the bin register address, a look-up table (LUT) may be used to perform the mapping. If a LUT is used, it may be implemented in any way known in the art.

During step 824, it is determined whether the integration is complete. If the integration is not complete, then a new light pulse 112 is emitted and step 804 is performed. If the integration is complete, then a readout of the content of histogram storage 518 is performed, e.g., by processor no as described, e.g., with respect to FIG. 6, and/or the histogram is processed, e.g., for ToF determinations.

Figure 9:
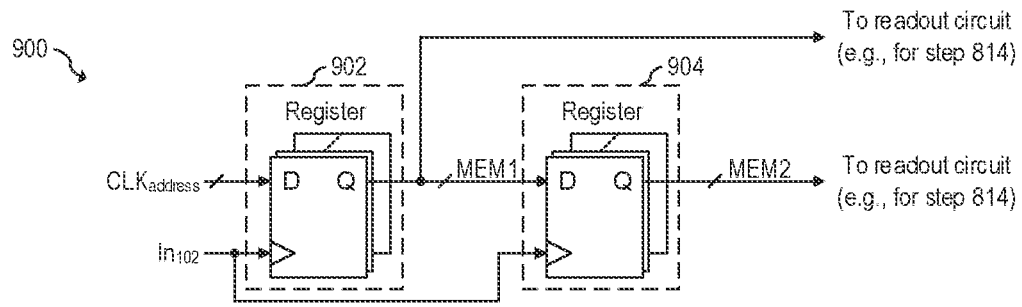
FIG. 9 shows a schematic diagram of a circuit for temporarily storing latched gray codes, according to an embodiment of the present invention.

FIG. 9 shows a schematic diagram of circuit 900 for temporarily storing latched gray codes (e.g., during step 810), according to an embodiment of the present invention. Circuit 900 may be implemented inside TDC 102, partially inside TDC 102, or outside TDC 102.

As shown, circuit 900 is capable of storing 2 gray-coded addresses per shot cycle. It is understood that circuit 900 can be modified so that is capable of storing a different number of gray-coded address per shot cycle, such as 1, 3, 4, or more.

During normal operation, and, e.g., as shown in FIG. 4 and steps 806, 808, and 810, upon activation of input $In_{102}$, the gray-coded address contained in reference address $CLK_{address}$ is latched into register 902, and the content of register 902 is latched into register 904 (e.g., in a shift register manner).

Figure 14:
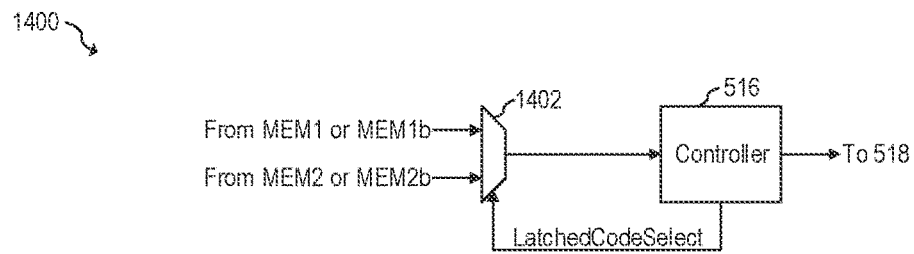
FIG. 14 shows a schematic diagram of a readout circuit, according to an embodiment of the present invention.

Once it is determined that it is time for readout of the latched codes (e.g., in step 812), the content of registers 902 and 904 is read (e.g., during step 814) by a readout circuit (such as shown in FIG. 14). The content of registers 902 and 904 may be reset prior to the next shot cycle, after the content of registers 902 and 904 is read.

Registers 902 and 904 may be implemented in any way known in the art. For example, in some embodiments, registers 902 (and 904) may be implemented with a plurality of latches and/or flip-flops. For example, in some embodiments, registers 902 (and 904) may be implemented with a plurality of single-ended or differential latches. In other embodiments, registers 902 and 904 include a plurality of flip-flops, such as D-flip-flops, where each flip-flop includes a differential latch such as shown in latch 1000 of FIG. 10, where $In_{102}$ and $In_{102}B$ form a differential signal that correspond to the single-ended signal $In_{102}$, shown in FIG. 9, and where $CLK_{address}<i>$ and $CLK_{address}B<i>$ form a differential signal for bit i of the single-ended signal $CLK_{address}$ shown in FIG. 9. In some embodiments, e.g., and as shown in FIG. 10, an inverter may optionally be is used to generate input $In_{102}B$.

As shown in FIG. 9, a single-ended implementation is also possible.

Figure 10:
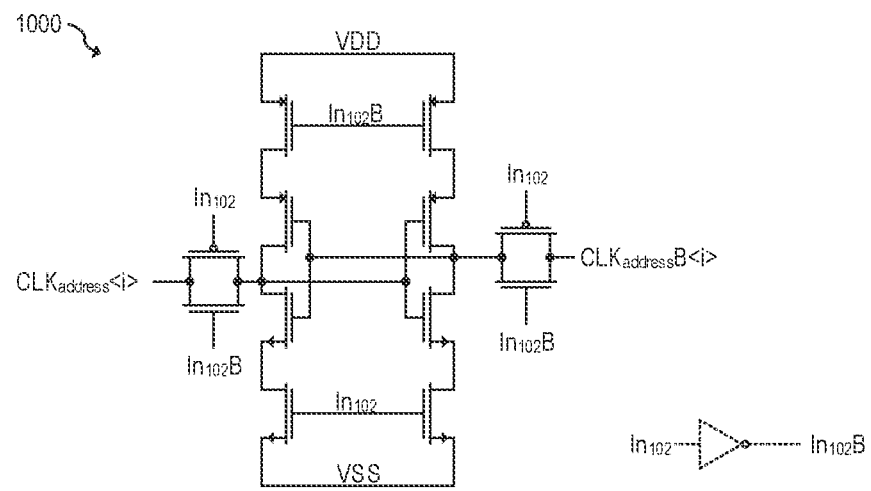
FIG. 10 shows a schematic diagram of a differential latch that may be used in the registers of FIG. 9.

In some embodiments, using a differential latch such as shown in FIG. 10 for latching the gray-coded address advantageously help to further reduce power consumption and/or increase the sample rate.

In some embodiments, a flag may be used to signal that the temporary memory (e.g., registers 902 and 904) is full so that no further SPAD activations are latched. For example, FIG. 11 shows a schematic diagram of circuit 1100 for temporarily storing latched gray codes, according to an embodiment of the present invention.

Circuit 1100 operates in a similar manner as circuit 900. Circuit 1100, however, generates a respective flag ($FLAG_{MEM1}$ and $FLAG_{MEM2}$) using flip-flops 1102 and 1104, respectively, to indicate that respective registers (902 and 904) have been latched. In some embodiments, once $FLAG_{MEM2}$ is asserted (logic "1"), registers 902 and 904 may no longer be updated during the current shot cycle (e.g., by preventing the clock inputs of registers 902 and 904 from toggling, e.g., by using an AND gate 1106 to gate the clock input of registers 902, 904, 1102, and 1104). The content of flip-flops 1102 and 1104 may be reset (e.g., back to logic "0") prior to the next shot cycle.

In some embodiments, using flags, such as $FLAG_{MEM1}$ and $FLAG_{MEM2}$ may advantageously allow for the resetting of just the flag flip-flops (1102 and 1104) instead of resetting of register 902 and 904, which can reduce current consumption during the reset of flip-flops, e.g., at the end of very shot cycle.

Figure 11:
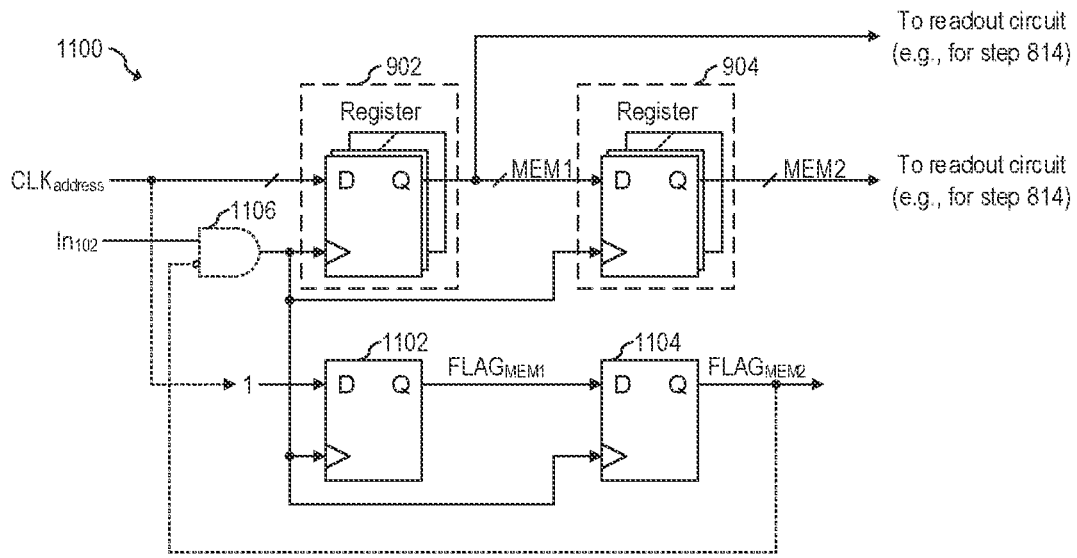
FIGS. 11-13 show schematic diagrams of circuits for temporarily storing latched gray codes, according to embodiments of the present invention.

In some embodiments, the input of flip-flop 1102 may be timed (e.g., instead of being hard-coded "logic 1," it may be based on $CLK_{address}$ as shown by the dotted line in FIG. 11). By using $CLK_{address}$ to gate flip-flop 1102, some embodiments may allow for preventing undesired code latching during portions of times, such as, e.g., during times when the corresponding SPADs are not fully enabled.

Figure 12:
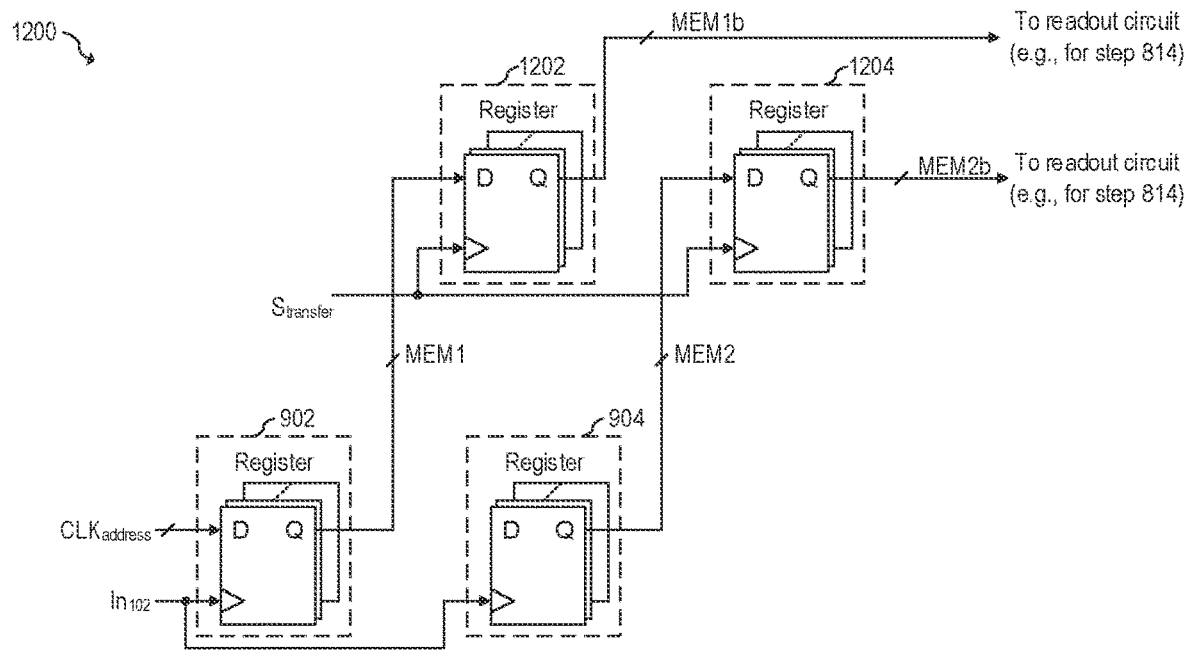

In some embodiments, an additional intermediate storage may be used, such as shown in FIG. 12. As shown in FIG. 12, circuit 1200 operates in a similar manner as circuit 900. Circuit 1200, however, includes additional registers 1202 and 1204 that can latch the content of registers 902 and 904, respectively, upon activation of signal $S_{transfer}$. Signal $S_{transfer}$ may be asserted, for example, when step 812 outputs yes. In some embodiments, the use of intermediate storage (registers 1202 and 1204) advantageously allows circuit 1200 to continue capturing SPAD activations while steps 814, 816, 818, 820 and 822 are being performed.

Figure 13:
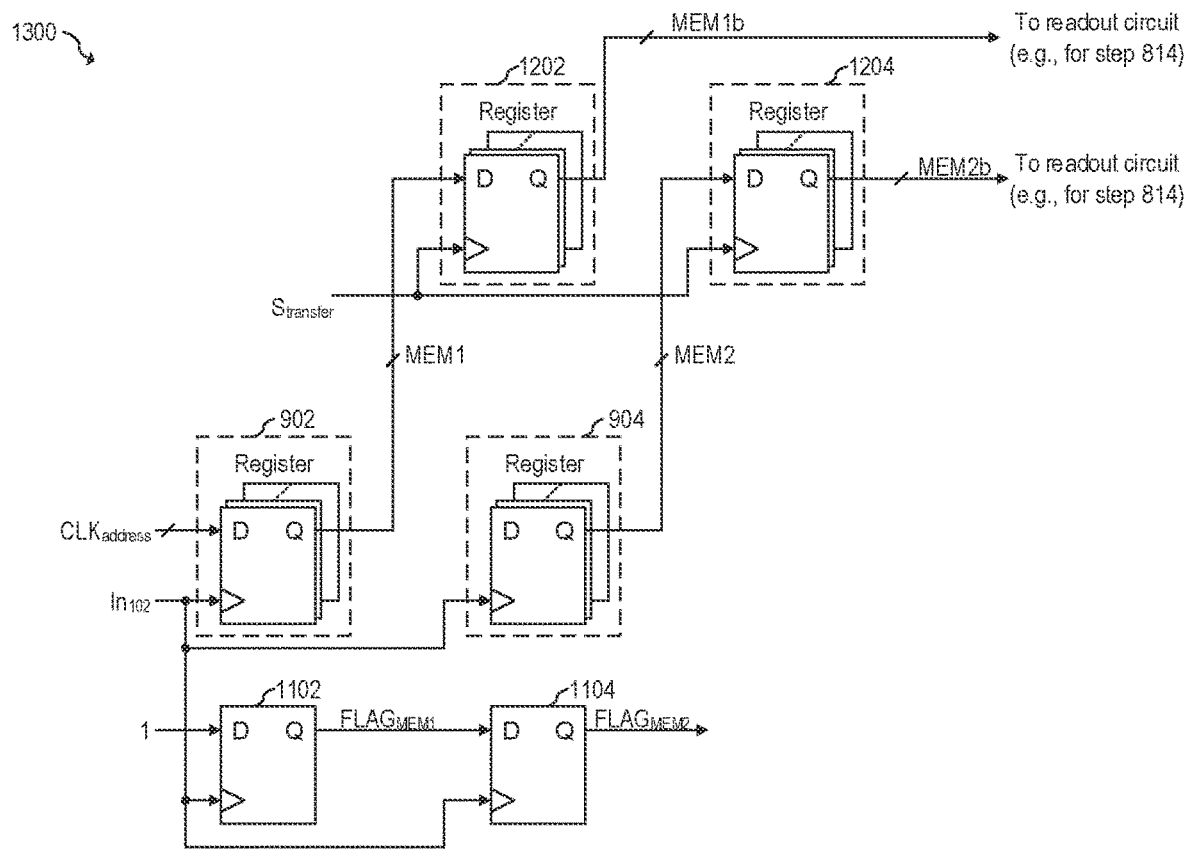

It is understood that circuits 1100 and 1200 may be combined, such as shown in FIG. 13.

FIG. 14 shows a schematic diagram of readout circuit 1400, according to an embodiment of the present invention. As shown in FIG. 14, multiplexer (MUX) 1402 is coupled to the outputs of registers 902 and 904.

During normal operation, controller 516 iterates (e.g., using signal LatchedCodeSelect) through each of the temporary registers (e.g., 902 and 904) to read their respective content (e.g., during step 814). Controller 516 then may perform steps 816, 818, 820, 822 and 824.

In some embodiments, the SPADs of SPAD array 104 are active before Gray-coded time reference $CLK_{address}$ is propagated across TDCs 102. To address such scenario, some embodiments dedicate a bit of the reference address $CLK_{address}$ (e.g., the MSB) to enable write operation of TDC 102 (e.g., to enable latching of registers 902 and 904). In other embodiments, bin 0 (associated with gray-coded reference address 0) is dedicated for initialization and is held until gray-coded reference $CLK_{address}$ is propagated. In yet other embodiments, the first X numbers of the sequence of gray-coded reference address are considered polluted and are thereby skipped. In some embodiments, X may be a number greater or equal to 1 and lower or equal to 32. A different number of skipped bins may also be used.

Figure 15:
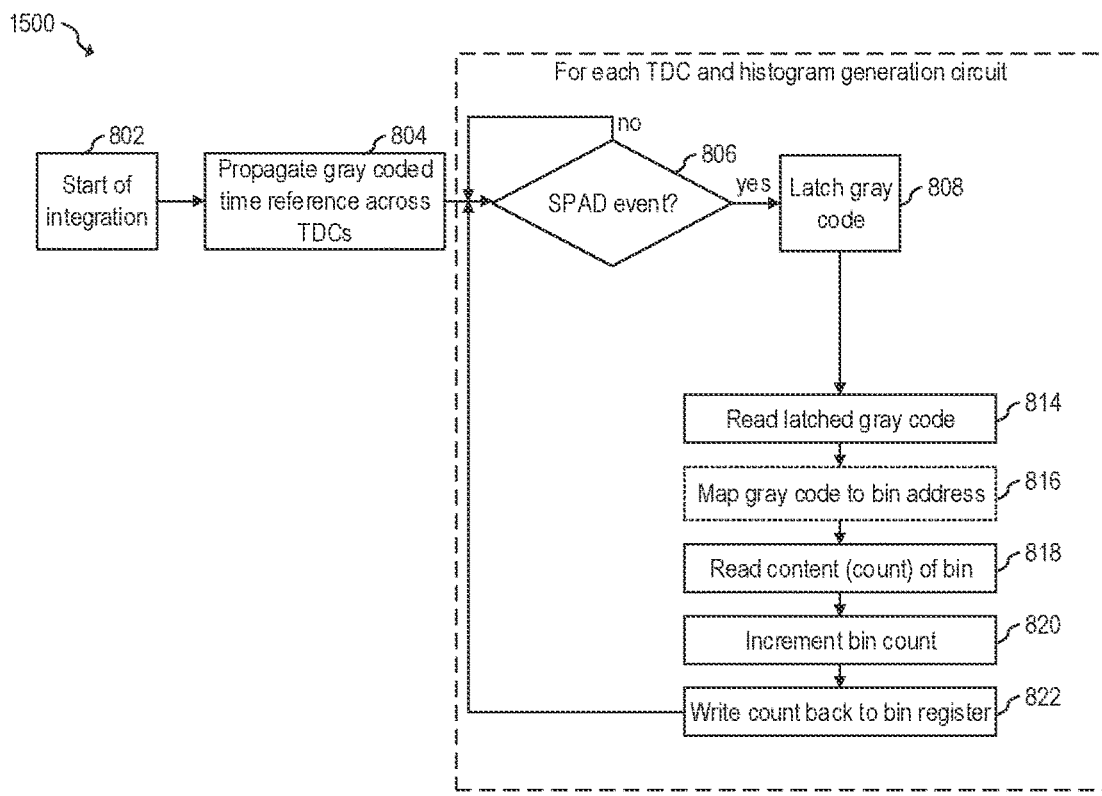
FIG. 15 shows a flow chart of an embodiment method for asynchronously generating ToF histograms using a gray-coded time reference, according to an embodiment of the present invention.

FIG. 15 shows a flow chart of embodiment method 1500 for asynchronously generating ToF histograms using a gray-coded time reference, according to an embodiment of the present invention. Steps 802, 804, 806, 808, 8-14, 816, 818, 820, and 822 may be performed in a similar manner as described with respect to method 800.

As shown in FIG. 15, after integration starts (in step 802), and the gray-coded time reference is propagated across TDCs (in step 804), for each TDC, when a SPAD event is detected (in step 806), the gray coded time reference is latched (in step 808), e.g., in register 902, the process of reading the latched gray code (814), mapping the gray code to a bin address (step 816), and reading, accumulating, and writing-back the bin count (in steps 818, 820, and 822, respectively) is asynchronously performed. During the time in which step s 808, 814, 816, 818, 820, and 822 are performed, any new SPAD event that may occur may be ignored.

Method 1500 may repeat for a plurality of emitted light pulses. Once the integration ends (step not shown), then the histograms generated by method 1500 may be read or processed, e.g., by processor 110.

Figure 16:
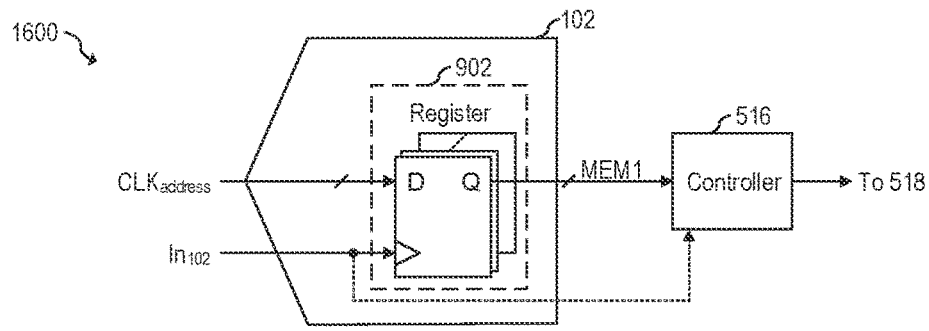
FIG. 16 shows a schematic diagram of a circuit for asynchronously generating a ToF histogram using a gray-coded time reference, according to an embodiment of the present invention.

FIG. 16 shows a schematic diagram of circuit 1600 for asynchronously generating a ToF histogram using a gray-coded time reference, according to an embodiment of the present invention. The operation of circuit 1600 may be understood, e.g., in view of method 1500.

During normal operation, upon activation of input $In_{102}$ (e.g., when $In_{102}$ transitions from low to high), a SPAD event is detected (in step 806). When a SPAD event is detected, the code that reference address $CLK_{address}$ has at the time input $In_{102}$ is asserted is latched into register 902 (in step 808). Then, controller 516 asynchronously determines that a SPAD event occur (e.g., by sensing input $In_{102}$, by detection a change in register 902, or in any other way) and reads from register 902 the latched code (in step 814), maps the gray code to the bin address (in step 816), and performs a read, accumulate, write-back operation into the corresponding bin address of histogram storage 518 (in steps 818, 820, and 822, respectively).

Example embodiments of the present invention are summarized here. Other embodiments can also be understood from the entirety of the specification and the claims filed herein.

Example 1. A method including: providing a gray-coded time reference to a time-to-digital converter (TDC); receiving an event from an event signal; latching the gray-coded time reference into a memory upon reception of the event signal; and updating a time-of-flight (ToF) histogram based on the latched gray-coded time reference.

Example 2. The method of example 1, where providing the gray-coded time reference includes propagating the gray-coded time reference across a single photon avalanche diode (SPAD) array.

Example 3. The method of one of examples 1 or 2, further including generating the gray-coded time reference by converting a binary-coded time reference into the gray-coded time reference using a binary to gray code converter.

Example 4. The method of one of examples 1 to 3, where receiving the event signal includes receiving a single photon avalanche diode (SPAD) activation signal from a SPAD coupled to an input of the TDC.

Example 5. The method of one of examples 1 to 4, where the SPAD is coupled to the input of the TDC via an OR tree.

Example 6. The method of one of examples 1 to 5, where the memory includes a register.

Example 7. The method of one of examples 1 to 6, where the register includes a plurality of differential latches.

Example 8. The method of one of examples 1 to 7, where updating the ToF histogram includes: reading a bin count from a bin register of a histogram storage, where the bin register corresponds to the latched gray-coded time reference; incrementing the bin count by one; and writing the incremented bin count into the bin register.

Example 9. The method of one of examples 1 to 8, where an address of the bin register is the latched gray-coded time reference.

Example 10. The method of one of examples 1 to 9, further including reading the ToF histogram by: generating a sequence of binary-coded addresses; converting the sequence of binary-coded addresses into a sequence of gray-coded addresses; and sequentially reading registers of a histogram storage based on the sequence of gray-coded addresses, where the histogram storage stores the ToF histogram.

Example 11. The method of one of examples 1 to 10, where receiving the event includes detecting a transition from a logic 0 to a logic 1 of the event signal.

Example 12. The method of one of examples 1 to 11, further including enabling the TDC based on a bit of the gray-coded time reference.

Example 13. The method of one of examples 1 to 12, where updating ToF histogram includes asynchronously updating the ToF histogram upon reception of the event.

Example 14. A circuit including: a first input configured to receive an event; a second input configured to receive a gray-coded time reference; a first register configured to latch the gray-coded time reference upon reception of the event; and a histogram generation circuit configured to update a bin register of a histogram storage, the bin register having an address based on a content of the first register.

Example 15. The circuit of example 14, further including a single photon avalanche diode (SPAD) coupled to the first input.

Example 16. The circuit of one of examples 14 or 15, further including an OR tree coupled between the SPAD and the first input.

Example 17. The circuit of one of examples 14 to 16, the histogram generation circuit is configured to update the bin register by: reading a bin count from the bin register; incrementing the bin count; and writing the bin register with the incremented bin count.

Example 18. The circuit of one of examples 14 to 17, where the first register includes a plurality of flip-flops, where each flip-flop of the plurality of flip-flops includes a differential latch.

Example 19. The circuit of one of examples 14 to 18, further including a second register configured to latch the content of the first register upon reception of the event.

Example 20. The circuit of one of examples 14 to 19, further including: a first flip-flop configured to latch a first value upon reception of the event; and a second flip-flop having an input coupled to an output of the first flip-flop so that after reception of a second event at the first input, the first and second flip-flop have a latched content equal to the first value.

Example 21. The circuit of one of examples 14 to 20, further including: an address controller configured to generate a binary-coded time reference; and a binary-to-gray converter configured to generate the gray-coded time reference based on the binary-coded time reference.

Example 22. The circuit of one of examples 14 to 21, where the histogram generation circuit is configured to asynchronously update the bin register of the histogram storage when the first input receives the event.

Example 23. A time-of-flight (ToF) system including: an illumination source configured to emit light pulses; a single photon avalanche diode (SPAD) array; a plurality of time-to-digital converters (TDCs) coupled to the SPAD array; and a plurality of histogram generation circuits, where each histogram generation circuit of the plurality of histogram generation circuits is coupled to a respective TDC of the plurality of TDCs, where each TDC includes: a first input coupled to a respective SPAD of the SPAD array, a second input configured to receive a gray-coded time reference, and a first register configured to latch the gray-coded time reference upon activation of the respective SPAD, and where each histogram generation circuit of the plurality of histogram generation circuits is configured to update a respective bin register of a respective histogram storage, the respective bin register having an address based on a content of the respective first register.

Example 24. The ToF system of example 23, where each histogram generation circuit is configured to asynchronously update the respective bin register upon activation of the respective SPAD.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
providing a time reference to a time-to-digital converter (TDC), the time reference being encoded according to a coding scheme in which a single bit of the time reference is updated during each sequential time step;
receiving an event from an event signal;
latching the time reference into a memory upon reception of the event signal; and
updating a time-of-flight (ToF) histogram based on the latched time reference.

2. The method of claim 1, wherein updating the ToF histogram comprises:
reading a bin count from a bin register of a histogram storage, wherein the bin register corresponds to the latched time reference;
incrementing the bin count by one; and
writing the incremented bin count into the bin register.

3. The method of claim 2, wherein an address of the bin register is the latched time reference.

4. The method of claim 2, further comprising mapping the latched time reference to an address of the bin register by using a look-up table (LUT).

5. The method of claim 1, further comprising enabling the TDC based on a bit of the time reference.

6. The method of claim 1, wherein latching the time reference into the memory upon reception of the event signal comprises:
determining a time to readout the latched time reference; and
before the determined time to readout the latched time reference, latching the time reference into the memory upon reception of the event signal, wherein updating the ToF histogram based on the latched time reference comprises updating the ToF histogram based on the latched time reference at the time to readout the latched time reference.

7. The method of claim 6, further comprising periodically emitting light pulses, wherein the event signal corresponds to a single photon avalanche diode (SPAD) activation signal, and wherein determining the time to readout the latched time reference is based on a predetermined pulse repetition time of the emitted light pulses.

8. The method of claim 7, wherein the memory comprises a first and second registers, and wherein latching the time reference into the memory comprises shifting content from the first register to the second register, and storing the latched time reference into the first register.

9. The method of claim 8, wherein updating the ToF histogram based on the latched time reference comprises reading the first and second registers.

10. The method of claim 8, further comprising generating first and second flags indicative of whether the first and second registers are latched, respectively.

11. The method of claim 10, wherein generating the first and second flags comprises generating the first and second flags using first and second flip-flops, respectively.

12. The method of claim 1, wherein the time reference is a gray-coded time reference, the method further comprising reading each bin count of the ToF histogram, wherein reading each bin count of the ToF histogram comprises:
generating a binary sequence of addresses;
converting the binary sequence of addresses into a gray-coded sequence of addresses; and
reading each bin count of the ToF histogram using the gray-coded sequence of addresses to obtain a sequence of bin counts ordered to correspond to the binary sequence of addresses.

13. The method of claim 1, wherein the ToF histogram is stored as a gray-coded ToF histogram.

14. The method of claim 1, further comprising latching a further time reference into the memory upon reception of a further event signal during the updating of the ToF histogram based on the latched time reference.

15. The method of claim 14, further comprising selecting between updating the ToF histogram based on the latched time reference and updating the ToF histogram based on the latched further time reference using a multiplexer coupled to the memory.

16. A method comprising:
provide a gray-coded time reference to a time-to-digital converter (TDC);
asynchronously detecting a single photon avalanche diode (SPAD) event;
latching the gray-coded time reference into a register upon detection of the SPAD event; and
updating a time-of-flight (ToF) histogram based on the latched gray-coded time reference.

17. The method of claim 16, wherein updating the ToF histogram based on the latched gray-coded time reference comprises:
reading a bin count from a bin register of a histogram storage, wherein the bin register corresponds to the latched time reference;
incrementing the bin count by one; and
writing the incremented bin count into the bin register.

18. A circuit comprising:
a first input configured to receive a single photon avalanche diode (SPAD) event;
a second input configured to receive a time reference, the time reference being encoded according to a coding scheme in which a single bit of the time reference is updated during each sequential time step;
a first register configured to latch the time reference upon reception of the SPAD event; and
a histogram generation circuit configured to update a bin register of a histogram storage, the bin register having an address based on a content of the first register.

19. The circuit of claim 18, wherein the histogram storage is configured to store a ToF time-of-flight (ToF) histogram as a gray-coded ToF histogram.

20. The circuit of claim 19, further comprising:
a binary-to-gray converter coupled to the histogram storage; and
a processor configured to:
provide a binary sequence of addresses to the binary-to-gray converter, and
receive from the histogram storage a sequence of bin counts of the gray-coded histograms ordered to correspond to the binary sequence of addresses.

\* \* \* \* \*